United States Patent [19]

Yoshioka

[11] Patent Number: 4,926,179
[45] Date of Patent: May 15, 1990

[54] DIGITAL TO ANALOG DATA DEMODULATION CIRCUIT

[75] Inventor: Yo Yoshioka, Kanagawa, Japan

[73] Assignee: Kabushiki Kaisha Toshiba, Kanagawa, Japan

[21] Appl. No.: 228,902

[22] Filed: Aug. 5, 1988

[51] Int. Cl.⁵ .............................................. H03M 1/66
[52] U.S. Cl. ..................................... 341/144; 341/126
[58] Field of Search ......................... 341/144, 126, 154

[56] References Cited

U.S. PATENT DOCUMENTS

| | | | |
|---|---|---|---|
| 3,949,299 | 4/1976 | Song | 341/144 X |
| 4,059,800 | 11/1977 | Jones, Jr. | 341/143 X |
| 4,570,153 | 2/1986 | Kobayashi et al. | 341/155 |
| 4,646,173 | 2/1987 | Kammeyer et al. | 375/42 X |
| 4,812,815 | 3/1989 | Miyakoshi et al. | 341/144 X |
| 4,862,170 | 8/1989 | Hashimoto et al. | 341/144 |

*Primary Examiner*—William M. Shoop, Jr.
*Assistant Examiner*—Sharon D. Logan
*Attorney, Agent, or Firm*—Finnegan, Henderson, Farabow, Garrett and Dunner

[57] ABSTRACT

A digital to analog data demodulating circuit adapted for selectively demodulating analog data from a plurality of digital data each having a different sampling frequency. The circuit includes an input terminal provided for selectively receiving the plurality of digital data, a digital filter coupled to the input means for shifting higher the sampling frequency of the digital data applied from the input terminal, a D/A converter coupled to the digital filter for generating first and second analog conversion data separated into a lower frequency band and a higher frequency band, the lower frequency band being alsmost conicident with the frequency band of the analog data digitized to the corresponding digital data and the higher frequency band having a center frequency coincident with the shifted sampling frequency and an LPF coupled to the D/A converter for removing the second analog conversion data from the output of the D/A converter.

7 Claims, 3 Drawing Sheets

DIGITAL TO ANALOG DATA DEMODULATION CIRCUIT

FIELD OF THE INVENTION

The present invention relates generally to a digital to analog data demodulation circuit, and more particularly, to a digital to analog data demodulation circuit adapted for selectively demodulating analog data from a plurality of digital data.

BACKGROUND OF THE INVENTION

There has been developed a digital to analog data demodulating circuit from digital data adapted for demodulating analog data from a plurality of digital data.

Recently, a multiple speeds compact disc player has been developed. The multiple speeds compact disc player is adapted for playing back CD records (CD: an abbreviation of Compact Disc) at different reproducing speeds, e.g., a standard reproducing speed and a fast reproducing speed. The fast speed reproducing of the CD records will be convenient for reducing time to record the CD records to tape recorders.

As is well known, analog data, such as audio signals, are recorded on the CD records in the forms of digital data. The analog data is digitized or PCM-modulated to a corresponding digital data by a prescribed sampling frequency. The PCM means a pulse code modulation.

When a CD record is played back at the standard reproducing speed, a digital data reproduced from the CD record has the prescribed sampling frequency. An analog data demodulated from the reproduced digital data almost coincides with the original analog data which is digitized to the digital data. When a CD record is played back at a prescribed fast reproducing speed, the frequency of a digital data reproduced from the CD record is increased in response to the fast reproducing speed cribbed sampling frequency. Thus, the sampling frequency of the reproduced digital data is shifted to a higher frequency. In addition, the frequency band of an analog data demodulated from the reproduced digital data is expanded wider.

In such a multiple speeds compact disc player, both a sampling frequency of digital data reproduced from the CD record and a frequency band of an analog data demodulated from the reproduced digital data vary in response to the reproducing speeds, as described above. Thus, the multiple speeds compact disc player must be provided with a digital to analog data demodulating circuit adapted for selectively demodulating analog data from a plurality of digital data.

Conventionally, such a digital to analog data demodulating circuit adapted for demodulating analog data from a plurality of digital data is constructed as shown in FIG. 1. In FIG. 1, an input terminal 11 is provided for selectively receiving a first and second digital data DA1 and DA2

Here it is assumed that the first digital data DA1 is digitized from a first original analog data AA1 having a first frequency band B1 extending from 0 Hz to 20 KHz. The digitization or the PCM modulation is carried out by sampling the first original analog data AA1 in using a first sampling frequency SF1 or 44 KHz. It is also assumed that the second digital data DA2 is digitized from a second original analog data AA2 having a second frequency band B2 extending from 0 Hz to 40 KHz. The digitization is carried out by sampling the second original analog data AA2 in using a second sampling frequency SF2 or 88 KHz, as twice as the first sampling frequency SF1.

For example, the first digital data DA1 is obtained when CD records are played back at the standard reproducing speed. Thus, the first frequency band B1 almost corresponds to the general audio frequency band. The second digital data DA2 is obtained when CD records are played back at a fast reproducing speed two times faster then the standard reproducing speed.

The first and second digital data DA1 and DA2 are selectively applied to a digital to analog converter (referred as D/A converter hereafter 12. The D/A converter 12 converts the first and second digital data DA1 and DA2 to corresponding first and second analog conversion data AB1 and AB2, respectively.

The first analog conversion data AB1 output from the D/A converter 12 has the frequency response characteristics, as shown in FIG. 2. As shown in FIG. 2, the first analog conversion data AB1 comprises two signal components AL1 and AH1 separated to two frequency bands, i.e., a first lower frequency band BL1 and a first higher frequency band BH1.

The first lower frequency band BL1 extends from 0 Hz to about 20 KHz so that the signal component AL1 therein almost coincides with the first original analog signal AA1 to be demodulated. The first higher frequency band BH1 is residually generated in accompanied with the operation of digital to analog conversion (referred as D/A conversion hereafter) in the D/A converter 12, as is well known. The first higher frequency band BH1 extends from a first center frequency CF1 equal to the first sampling frequency SF1 or 44 KHz by every band of 20 KHz to lower and upper frequency portions. Thus, the first higher frequency band BH1 extends from about 24 KHz to 64 KHz. The signal component AH1 in the first higher frequency band BH1 constitutes an undesired residual signal generated in the D/A conversion, i.e., a noise.

The second analog conversion data AB2 output from the D/A converter 12 has the frequency response characteristics, as shown in FIG. 3. As shown in FIG. 3, the second analog conversion data AB2 also comprises two signal components AL2 and AH2 separated to two frequency bands. i.e., a second lower frequency band BL2 and a second higher frequency band BH2.

The second lower frequency band BL2 extends from 0 Hz to about 40 KHz so that the signal component AL2 therein almost coincides with the second original analog signal AA2 to be demodulated. The second higher frequency band BH2 also is residually generated in accompanied with the operation of D/A conversion in the D/A converter 12. The second higher frequency band BH2 extends from a second center frequency CF2 equal to the second sampling frequency SF2 or 88 KHz by every band of 40 KHz to lower and upper frequency portions. Thus, the second higher frequency band BH2 extends from about 48 KHz to 128 KHz. The signal component AH2 in the second higher frequency band BH2 constitutes another undesired residual signal generated in the D/A conversion, i.e., another noise.

The first and the second analog conversion data AB1 and AB2 output from the D/A converter 12 are parallelly applied to a pair of first and second low pass filters (referred as LPF(s) hereafter 13 and 14. The first LPF 13 has a first cut-off frequency of 22 kHz. Thus, the first LPF 13 allows the transmission of frequency signals lower than the first cut-off frequency but inhibits the transmission of frequency signals higher than the first cut-off frequency. The second LPF 14 has a second cut-off frequency of 44 kHz. Thus, the second LPF 14 allows the transmission of frequency signals lower than the second cut-off frequency, but inhibits the transmission of frequency signals higher than the second cut-off frequency.

Thus, the first LPF 13 outputs the desired signal AL1 almost coincident with the first original analog signal AA1 in the first lower frequency band BL1 but eliminates the undesired residual signal AH1 in the first higher frequency band BH1, when the first analog conversion data AB1 is applied thereto. The second LPF 14 outputs the desired signal AL2 almost coincident with the second original analog signal AA2 in the second lower frequency band BL2 but eliminates the undesired residual signal AH2 in the second higher frequency band BH2, then the second analog conversion data AB2 is applied thereto.

The first LPF 13 can work on the other signal. i.e., the second analog conversion data AB2 so as to output signals in a lower part of the second lower frequency band BL2. The second LPF 14 can also work on the other signal, i.e., the first analog conversion data AB1 so as to output signals both in the first lower frequency band BL2 and a lower part of the first higher frequency band BH1. However, the signal in the lower part of the second lower frequency and BL2 output from the first LPF 13 and the signals in the first lower frequency band BL2 and the lower part of the first higher frequency band BH1 output from the second LPF 14 are removed as described later.

The first and second LPFs 13 and 14 are coupled to first and second switched terminals 15a and 15b of a switch 15, respectively. A switching terminal 15c of the switch 15 is coupled to an output terminal 16 of the circuit. Thus, the first and second LPFs 3 and 14 are selectively coupled to the output terminal 16 through the switch 15.

The switch 15 is operated in interlocked with the selective application of the first and second digital data DA1 and DA2 onto the input terminal 11 Thus, the signal AL1 in the first lower frequency band BL1 of the first analog conversion data AB1 is obtained on the output terminal 16 through the first LPF 13 and the switch 15, when the first digital data DA1 is applied to the input terminal 11 The signal AL2 in the second lower frequency band BL2 of the second analog conversion data AB2 is obtained on the output terminal 16 through the second LPF 14 and the switch 15, hen the second digital data DA2 is applied to the input terminal 11.

However, the conventional digital to analog data demodulating circuit for selectively demodulating analog data from a plurality of digital data, as shown in FIG. 1, has a drawback as described below.

The conventional digital to analog data demodulating circuit includes a plurality of analog LPFs in response to the number of digital data which are selectively applied to the circuit. The analog LPF is constituted by a considerable number of circuit elements, such as capacitors, resistors and/or inductors.

As is well known, such a circuit element, e.g., a capacitor is not suitable for making on integrated circuits. Thus, the conventional digital to analog data demodulating circuit has been complicated in construction, large in size and high in cost. Further, the conventional digital to analog data demodulating circuit has not been suitable for making on integrated circuits.

SUMMARY OF THE INVENTION

It is, therefore an object of the present invention to provide a digital to analog data demodulating circuit for selectively demodulating analog data from a plurality of digital data which is simple in construction small in size and low in cost.

Another object of the present invention is to provide a digital to analog data demodulating circuit for selectively demodulating analog data from a plurality of digital data which is suitable for making on integrated circuits.

In order to achieve the above object, a digital to analog data demodulating circuit for selectively demodulating analog data from a plurality Of digital data according to one aspect of the present invention includes an input terminal provided for selectively receiving the plurality of digital data, a digital filter coupled to the input means for shifting higher the sampling frequency of the digital data applied from the input terminal, a D/A converter coupled to the digital filter for generating first and second analog conversion data separated into a lower frequency band and a higher frequency band, the lower frequency band being almost coincident with the frequency band of the analog data digitized to the corresponding digital data and the higher frequency band having a center frequency coincident with the shifted sampling frequency and an LPF coupled to the D/A converter for removing the second analog conversion data from the output of the D/A converter.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
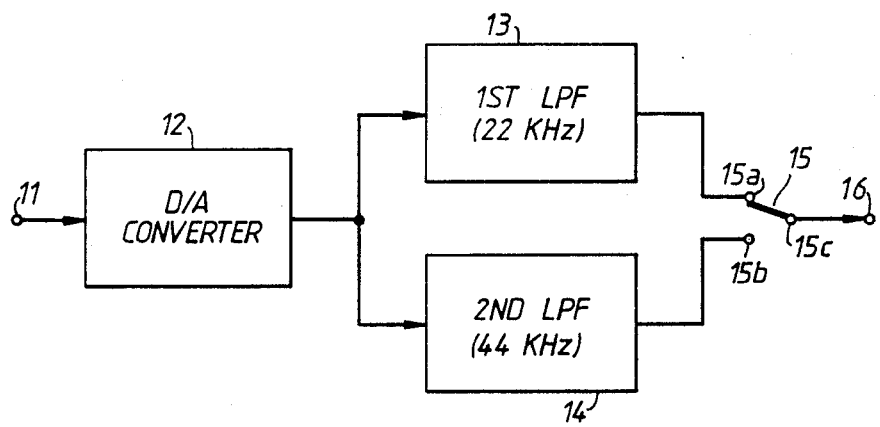
FIG. 1 is a block diagram showing an example of a conventional digital to analog data demodulating circuit for selectively demodulating analog data from a plurality of digital data.
Figure 2:
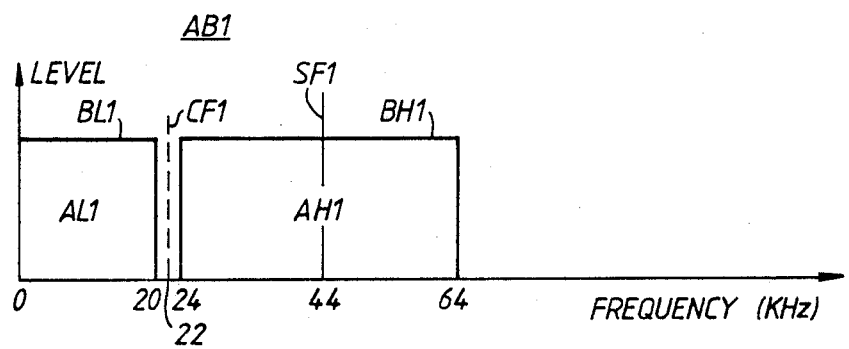
FIGS. 2 and 3 are graphs showing the frequency response characteristics of signals output from the D/A converter 12 in FIG. 1.
Figure 3:
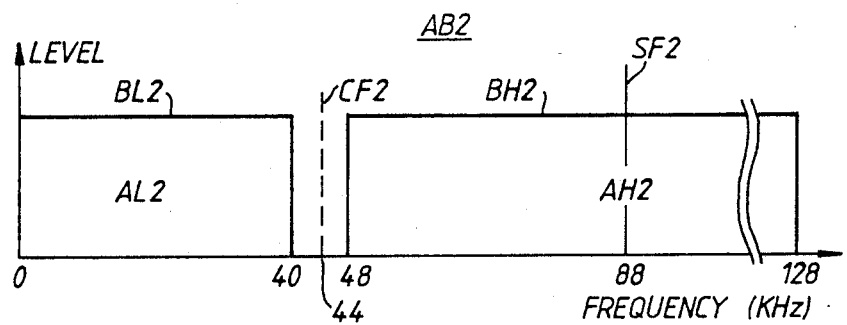

The present invention will be described in detail with reference to the FIGS. 4, 5, 6 and 7. Throughout the drawings, reference numerals or letters used in FIG. 1, 2 and 3 (Prior Arts) will be used to designate like or equivalent elements for simplicity of explanation.

Figure 4:
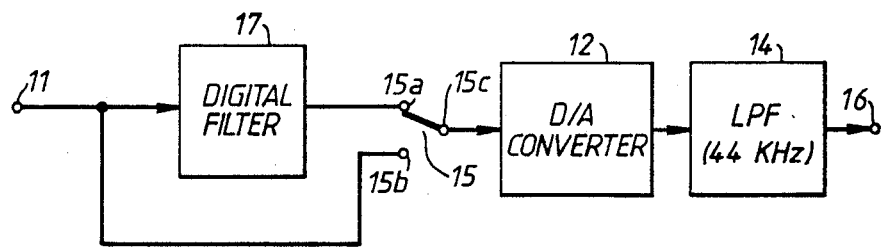
FIG. 4 is a block diagram showing a first embodiment of the digital to analog data demodulating circuit for selectively demodulating analog data from a plurality of digital data according to the present invention.

Referring now to FIG. 4, a first embodiment of the digital to analog data demodulating circuit for selectively demodulating analog data from a plurality of digital data according to the present invention will be described in detail. In FIG. 4, an input terminal 11 is provided for selectively receiving a first and second digital data DA1 and DA2.

Here, the first digital data DA1 is digitized from a first original analog data AA1 having a first frequency band B1 extending from 0 Hz to 20 KHz by sampling with a first sampling frequency SF1 or 44 KHz. The second digital data DA2 also id digitized from a second original analog data AA2 having a second frequency band B2 extending from 0 Hz to 40 KHz by sampling with a second sampling frequency SF2 or 88 KHz, as twice as the first sampling frequency SF1.

For example, the first digital data DA1 is obtained when CD records are played back at the standard reproducing speed. Thus, the first frequency band B1 almost corresponds to the general audio frequency band. The second digital data DA2 is obtained when CD records are played back at a fast reproducing speed two times faster then the standard reproducing speed.

The first and second digital data DA1 and DA2 are applied to a digital filter 17 and a second switched terminal 15b of a switch 15 in parallel. An output of the digital filter 17 is applied to a first switched terminal 15c of a switch 15. In other words, the first and second digital data DA1 and DA2 are applied to the switch 15 directly or indirectly through the digital filter 17. The switch 15 will be described in detail later.

The digital filter 17 carries out a two time over sampling operation on an input digital data. Thus, the sampling frequency of the digital data is multiplied in twice. For example, the first sampling frequency SF1 or 44 KHz of the first digital data DA1 is shifted to the frequency of 88 KHz, when the first digital data DA1 is applied to the digital filter 17.

An output digital data DB1 of the digital filter 17, i.e., a third digital data DB3 is applied to the first switched terminal 15a. A switching terminal 16c of the switch 15 is coupled to a D/A converter 12. The switch 15 is operated in interlocked with the selective application of the first and second digital data DA1 and DA2 onto the input terminal 11. Thus, the second and third digital data DA2 and DB3 are selectively applied to the D/A converter 12. The D/A converter 12 converts the second and third digital data DA2 and DB3 to corresponding second and third analog conversion data AB2 and AB3, respectively.

Figure 5:
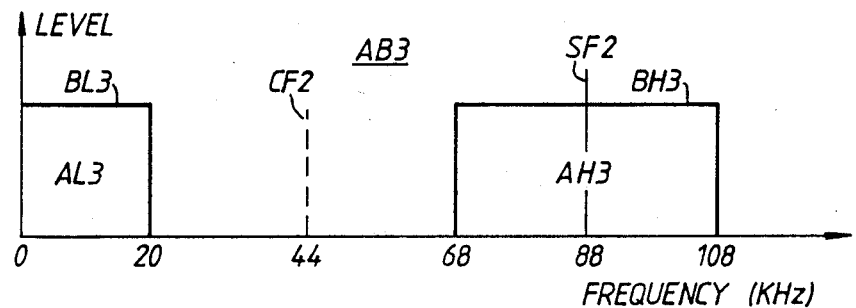
FIG. 5 and 6 are graphs showing the frequency response characteristics of signals output from the D/A converter 12 in FIG. 4.

The third analog conversion data AB3 output from the D/A converter 12 has the frequency response characteristics as shown in FIG. 5. As shown in FIG. 5, the third analog conversion data AB3 comprises two signal components AL3 and AH3 separated to two frequency bands, i.e., a third lower frequency band BL3 and a third higher frequency band BH3.

The third lower frequency band BL3 extends from 0 Hz to about 20 KHz so that the signal component AL3 therein almost coincides with the first original analog signal AA1 to be demodulated. The third higher frequency band BH3 is residually enerated in accompanied with the operation of digital to the D/A conversion in the D/A converter 12. The third higher frequency band BH3 extends from a center frequency equal to the second sampling frequency SF2 or 88 KHz by every band of 20 KHz to lower and upper frequency portions. Thus, the third higher frequency band BH3 extends from about 68 KHz to 108 KHz. The signal component AH3 in the third higher frequency band BH3 constitutes an undesired residual signal generated in the D/A conversion, i.e., a noise.

Figure 6:
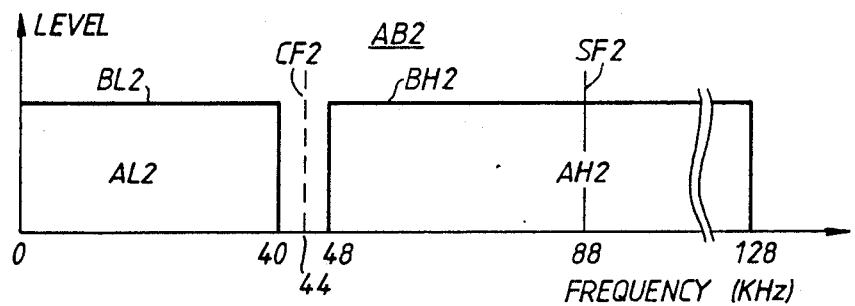

The second analog conversion data AB2 output from the D/A converter 12 has the frequency response characteristics, as shown in FIG. 6. As shown in FIG. 6, the second analog conversion data AB2 also comprises two signal components AL2 and AH2 separated to two frequency bands, i.e., a second lower frequency band BL2 and a second higher frequency band BH2.

The second lower frequency band BL2 extends from 0 Hz to about 40 KHz so that the signal component AL2 therein almost coincides with the second original analog signal AA2 to be demodulated. The second higher frequency band BH2 also is residually generated in accompanied with the operation of D/A conversion in the D/A converter 12. The second higher frequency band BH2 extends from a second center frequency CF2 equal to the second sampling frequency SF2 or 88 KHz by every band of 40 KHz to lower and upper frequency portions. Thus, the second higher frequency band BH2 extends from about 48 KHz to 128 KHz. The signal component AH2 in the second higher frequency band BH2 constitutes another undesired residual signal generated in the D/A conversion, i.e., another noise.

The second and third analog conversion data AB2 and AB3 output from the D/A converter 12 are applied to an LPF 14. The LPF 14 has a cut-off frequency of 44 kHz. Thus, the LPF 14 allows the transmission of frequency signals lower than the second cut-off frequency, but inhibits the transmission of frequency signals higher than the second cut-off frequency.

Thus, the LPF 14 outputs the desired signal AL3 almost coincident with the first original analog signal AA1 in the third lower frequency band BL3 but eliminates the undesired residual signal AH3 in the third higher frequency band BH3, when the third analog conversion data AB3 is applied thereto. The LPF 14 also outputs the desired signal AL2 almost coincident with the second original analog signal AA2 in the second lower frequency band BL2 but eliminates the undesired residual signal AH2 in the second higher frequency band BH2, when the second analog conversion data AB2 is applied thereto.

The digital filter 17 can work on the other signal, i.e. the second digital data DA2 so as to shift the second sampling frequency SF2 or 88 KHz to the two time multiplied frequency of 176 KHz. However, the output of the digital filter 17 is cut off by the switch 15, when the second digital data DA2 is applied to the input terminal 11. In this time, the second digital data DA2 applied to the input terminal 11 is directly applied to the D/A converter 12, as described before.

According to the first embodiment, the sampling frequency of the first digital data DA1 is unified to the sampling frequency SF2 of the second digital data DA2. As a result, all the undesired residual signals AH3 and AH2 arising in accompanied with the D/A conversion are placed in the frequency band at the second center frequency CF2 or 88 KHz. Thus, the singular LPF 14 can eliminates both the undesired residual signals AH3 and AH2.

Figure 7:
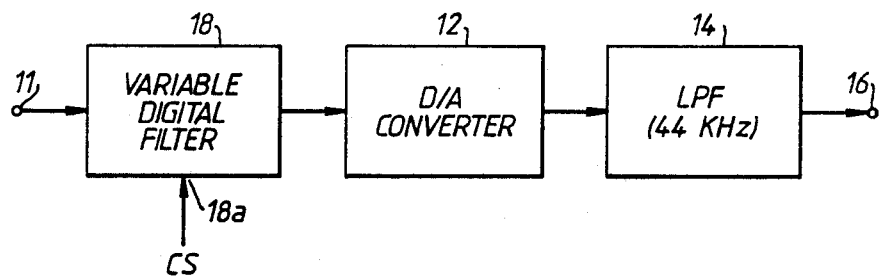
FIG. 7 is a block diagram showing a second embodiment of the digital to analog data demodulating circuit for selectively demodulating analog data from a plurality of digital data according to the present invention.

Referring now to FIG. 7, a second embodiment of the digital to analog data demodulating circuit for demodulating analog data from digital data according to the present invention will be described in detail. The second embodiment of the digital to analog data demodulating circuit is different from the first embodiment in followings.

In FIG. 7, a variable digital filter 18 is coupled between the input terminal 11 and the D/A converter 12. The variable digital filter 18 carries out mn over sampling operation on digital data applied thereto. A multiple in the over sampling operation varies in response to a prescribed control signal CS applied to a control terminal 18a of the variable digital filter 18. The control signal CS varies in accompanied with the input digital data selectively applied to the input terminal.

Thus, sampling frequencies of all input digital data are multiplied in prescribed times. For example, the sampling frequency SF1 or 44 KHz of the first digital data DA1 is shifted to the frequency of 176 KHz. four times the original sampling frequency SF1 or 44 KHz. When the first digital data DA1 is applied to the digital filter 17. The sampling frequency SF2 or 88 KHz of the second digital data DA2 is shifted to the frequency of 176 KHz, two times the original sampling frequency SF2 or 88 KHz, when the second digital data DA2 is applied to the digital filter 17.

According to the second embodiment, all the sampling frequencies SF1 and SF2 of the first and second digital data DA1 and DA2 are unified to the other sampling frequency, e.g., 176 KHz higher than that of the second digital data DA2 As a result, all the undesired residual signals AH1 and AH2 arising in accompanied with the D/A conversion are placed in the frequency band at the center frequency of 176 KHz. Thus, the singular LPF 14 can eliminates all the undesired redial signals AH1 and AH2.

As described above, the present invention can provide an extremely preferable digital to analog data demodulating circuit for selectively demodulating analog data from a plurality of digital data.

While there has been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A digital to analog data demodulating circuit adapted for selectively demodulating analog data from a plurality of digital data each having a different sampling frequency comprising:
    an input means provided for selectively receiving the plurality of digital data;
    a shifting means coupled to the input means for shifting higher the sampling frequency of the digital data applied from the input means;
    a digital to analog converter means coupled to the shifting means for generating first and second analog conversion data separated into a lower frequency band and a higher frequency band, the lower frequency band being almost coincident with the frequency band of the analog data digitized to the corresponding digital data and the higher frequency band having a center frequency coincident with the shifted sampling frequency: and
    a filter means coupled to the digital to analog converter means for removing the second analog conversion data from the output of the digital to analog converter means.

2. The circuit of claim 1 wherein the shifting means includes a digital filter means for or carrying out a prescribed over sampling operation on the digital data applied thereto.

3. The circuit of claim 2 wherein the digital filter means includes a variable digital filter, a multiple of the over sampling operation of the variable digital filter being variable in interlocked with the digital data selectively applied to the input means.

4. The circuit of claim 3 wherein the digital filter means includes means for shifting the different sampling frequencies to a prescribed frequency higher than either of the different sampling frequencies.

5. The circuit of claim 1 further comprising a switch means for selectively transmitting the digital data applied directly from the input means and indirectly from the shifting means to the digital to analog converter means in interlocked with the digital data selectively applied to the input means.

6. The circuit of claim 5 wherein the switch means is directly coupled to the input means in response to the digital data having the highest sampling frequency.

7. The circuit of claim 6 wherein the shifting mean includes a digital filter means for carrying out a prescribed over sampling operation on the digital data applied thereto so as to shift the sampling frequency of the digital data to the highest sampling frequency.

* * * * *

UNITED STATES PATENT AND TRADEMARK OFFICE
CERTIFICATE OF CORRECTION

PATENT NO. : 4,926,179

DATED : May 15, 1990

INVENTOR(S) : Yo Yoshioka

It is certified that error appears in the above-identified patent and that said Letters Patent is hereby corrected as shown below:

On the title page, after item [22], insert the following:

--[30] Foreign Application Priority Data
August 5, 1987 [JP]    Japan ............... 62-194295--.

Signed and Sealed this

Thirteenth Day of April, 1993

Attest:

STEPHEN G. KUNIN

*Attesting Officer*         Acting Commissioner of Patents and Trademarks